United States Patent [19]

Debbaut

[11] Patent Number: 4,600,261
[45] Date of Patent: Jul. 15, 1986

[54] APPARATUS AND METHOD FOR PROTECTION OF ELECTRICAL CONTACTS

[75] Inventor: Christian A. M. Debbaut, Alviso, Calif.

[73] Assignee: Raychem Corporation, Menlo Park, Calif.

[21] Appl. No.: 434,011

[22] Filed: Oct. 12, 1982

[51] Int. Cl.$^4$ ............................................. H01R 13/52
[52] U.S. Cl. .................................. 339/116 C; 29/877; 174/76
[58] Field of Search ........... 339/116 R, 116 C, 115 R, 339/49 B, 115 C, 143 R; 29/877, 862, 863; 174/76

[56] References Cited

U.S. PATENT DOCUMENTS

| Re. 30,321 | 7/1980 | Brauer et al. |
|---|---|---|
| Re. 31,389 | 9/1983 | Brauer et al. |
| 3,187,088 | 6/1965 | Warner |
| 3,228,820 | 1/1966 | Samson |
| 3,427,393 | 2/1969 | Masterson |
| 3,485,787 | 12/1969 | Haefele et al. |
| 3,619,481 | 11/1971 | Smith |
| 3,649,436 | 3/1972 | Buese |
| 3,678,174 | 7/1972 | Ganzhorn |
| 3,718,619 | 2/1973 | Rustad |
| 3,731,258 | 5/1973 | Spicer ........................... 339/49 B X |
| 3,801,532 | 4/1974 | Olstowski |
| 3,827,999 | 8/1974 | Crossland |
| 3,897,129 | 7/1975 | Farrar, Jr. ...................... 339/116 C |
| 3,916,082 | 10/1975 | Gillemot |
| 3,928,704 | 12/1975 | Heidingsfeld |
| 3,929,949 | 12/1975 | Day et al. |
| 3,985,951 | 10/1976 | Harris |
| 4,025,717 | 5/1977 | Whittingham |
| 4,168,258 | 9/1979 | Brauer et al. |
| 4,171,998 | 10/1979 | Brauer et al. |
| 4,176,239 | 11/1979 | Brauer et al. |
| 4,231,986 | 11/1980 | Brauer et al. |
| 4,281,210 | 7/1981 | Brauer et al. |
| 4,297,155 | 10/1981 | Jervis |
| 4,369,284 | 1/1983 | Chen |

FOREIGN PATENT DOCUMENTS 2070658  9/1981  United Kingdom ................ 428/904

Primary Examiner—Z. R. Bilinsky
Attorney, Agent, or Firm—Dennis E. Kovach; Stephen C. Kaufman; T. Gene Dillahunty

[57] ABSTRACT

An apparatus and method for protection of electrical contacts. The protection apparatus ensures that the electrical contacts are protected when they are otherwise located in an adverse environment. To this end, the protection apparatus includes an insulating gel that is characterized by a cone penetration value from approximately 150 to 350 ($10^{-1}$ mm); an ultimate elongation of at least approximately 200%; a maximum tensile strength of approximately 20 psi; and a cohesive strength greater than its adhesive strength. The protection apparatus further includes a first means to contain the gel, a second means to retain the gel within the first means and a force means which acts on the first means so that the gel is maintained in compressive contact with the electrical contacts and substantially encapsulates a conductive portion of the electrical contacts.

19 Claims, 2 Drawing Figures

APPARATUS AND METHOD FOR PROTECTION OF ELECTRICAL CONTACTS

TECHNICAL FIELD

The present invention relates to electrical contacts and more particularly to an apparatus and method for protection of such electrical contacts within an adverse environment.

BACKGROUND ART

For the purposes of the instant application, an electrical contact refers to an electro-mechanical device that may be employed when it is desired to readily connect (or disconnect) a first-insulated conductor to (or from) a second insulated conductor. Such a device is included, for example, in a conventional telephone circuit wire connector or in a conventional telephone electrical termination block of the type that provides telephone service to a customer.

In order to explain how an electrical contact is included in a telephone electrical termination block, attention is directed to FIG. 1 which shows a typical termination block 10. The termination block 10 includes a plurality of binding posts 12 which are, in fact, the electrical contacts. The binding posts 12 each comprise a small screw-type contact that facilitates the connection or disconnection of the first and second insulated conductors. Here, the first conductor may comprise a drop or service wire 14 that is wrapped around the screw-type contact so as to provide a connection between the customer and the termination block 10. The second conductor, on the other hand, may comprise a cable stub 16 which is pre-wired to a hermetically sealed portion of the termination block 10.

Although an end lead of the cable stub 16 is hermetically sealed within a portion of the termination block 10, the binding posts 12 (which connect one end of the service wire 14) may be exposed to the outside environment. The binding posts 12 are typically kept in this exposed condition in order to facilitate a craftsperson's reentry to the termination block 10 in order to effect repairs or change a service connection.

If the binding posts 12 remain exposed but unprotected from the outside environment, they may be affected by environmental agents including dirt, plant life, moisture, corrosion deposits and insects. These agents, however, can be adversative to the termination block 10 because they may effect a conductive bridge between some or all of the binding post contacts. This conductive bridge, in turn, may provide a means for the creation of noise and may produce an electrical short-circuit within the termination block. It is noted in particular, that such termination blocks that are left unprotected within humid or moist environments can incur a critical loss of insulation resistance between binding post contacts which can result in a temporary or permanent disruption of termination block operation or customer service.

In order to avoid disruption of service, therefore, it is important that the termination block be maintained so that it is resistant to the cited adverse environmental agents and can remain moisture insensitive. Consequently, it is important that the binding post contacts (or electrical contacts) be provided with a protection means (of the type indicated generally by numeral 18 in FIG. 1) that insures their reliable and safe operation within an otherwise adverse and moisture-laden environment.

In order to select an appropriate protection means for electrical contacts, it is advantageous to realize the following design objectives. Thus, the protection means should not obstruct or delay a craftsperson's access to the reenterable electrical contacts. At the same time, and as its name suggests, the protection means should protect the electrical contacts from the above described adverse environmental agents, including a high humidity environment. To these design objective ends, it is advantageous that the protection means utilize materials that are non-hazardous, possess acceptable electrical properties including a desired insulation resistance and remain substantially inert toward a molded plastic substrate which typically houses the electrical contacts.

The prior art addresses these stated design objectives by recourse to, for example, powders, foams, plastic gaskets, grease caulking guns and "hot-pour" liquids that cure in situ. These prior art protection means do not, however, in an entirely satisfactory manner, meet the required design objectives. Notably, as exemplified by the disclosure entitled Two-Part Reactive Dielectric Filler Composition in the U.S. Pat. No. 4,102,716 to Graves, et al., the hot-pour liquid composition must be formed by pouring it into a closure containing insulating conductors and then waiting for a delay period of upwards of two hours for the composition to gel or cure. Other illustrative disclosures, like that of U.S. Pat. No. 3,897,129 to Farrar, Jr., leave a careful reader with an unclear idea as to how a craftspreson can make numerable reentrys to the electrical contacts while insuring that a protective agent (here, grease) is always adequately applied to the electrical contacts. The cited inadequacies of these prior art disclosures suggest that a need exists for a protection means for electrical contacts that is responsive to the enumerated difficulties and satisfies the aforementioned design objectives.

The present invention fulfills this need and satisfies the design objectives by providing a unique apparatus and method for protection of electrical contacts. The apparatus of the present invention does not obstruct or delay a craftsperson's repeated reentrys to the electrical contact. At the same time, the present invention safely protects the electrical contacts even when they are exposed to an adverse environment. The present invention may consequently be employed with a variety of electro-mechanical devices like connectors or termination blocks where it is important to have ready access to the device while insuring, nevertheless, that the device is protected from the adverse environment.

DISCLOSURE OF THE INVENTION

Accordingly, it is an object of the present invention to provide a protection apparatus for electrical contacts.

It is a feature of the present invention that it enables a craftsperson to make numerable reentrys to the electrical contacts while ensuring that the electrical contacts are protected when they are otherwise located in an adverse environment.

It is an advantage of the present invention that it may be employed with electro-mechanical devices like termination blocks that include electrical contacts.

In accordance with the present invention, there is provided a protection apparatus for an electrical contact. The apparatus includes an insulating gel that is characterized by a cone penetration value from approximately 150 to 350 ($10^{-1}$ mm); an ultimate elongation of at least approximately 200%; a maximum tensile strength of approximately 20 psi; and a cohesive strength greater than its adhesive strength. The apparatus further includes a first means to contain the gel, a second means to retain the gel within the first means and a force means which acts on the first means so that the gel is maintained in compressive contact with the electrical contact and substantially encapsulates a conductive portion of the electrical contact.

BRIEF DESCRIPTION OF THE DRAWINGS:

These and other features of the present invention will be more clearly understood from a consideration of the following description taken in connection with the accompanying drawings in which.

DETAILED DESCRIPTION OF THE INVENTION

Figure 1:
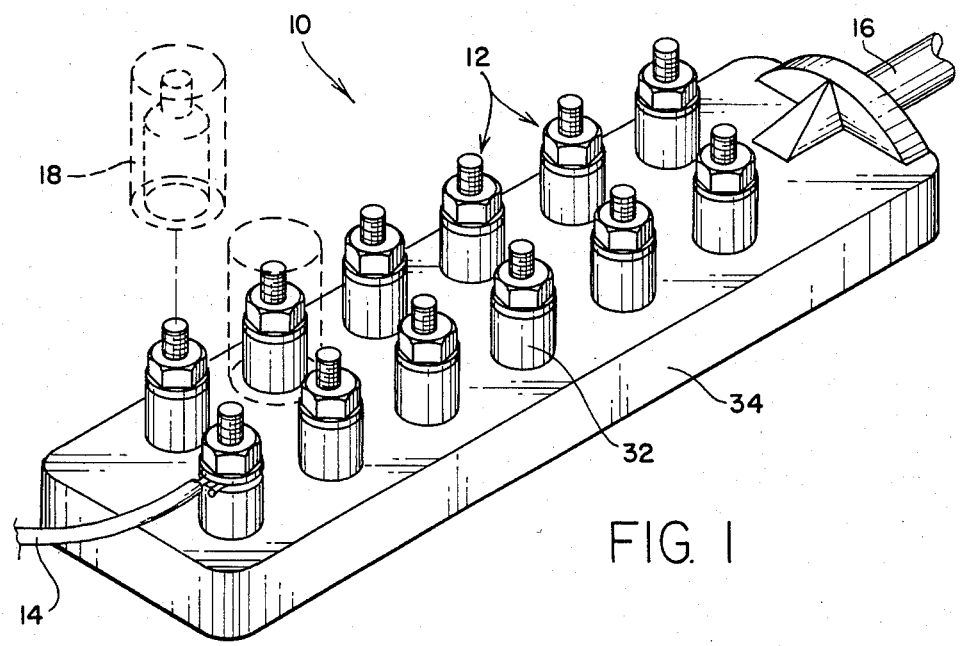
FIG. 1 provides a perspective view of a conventional telephone electrical termination block.
Figure 2:
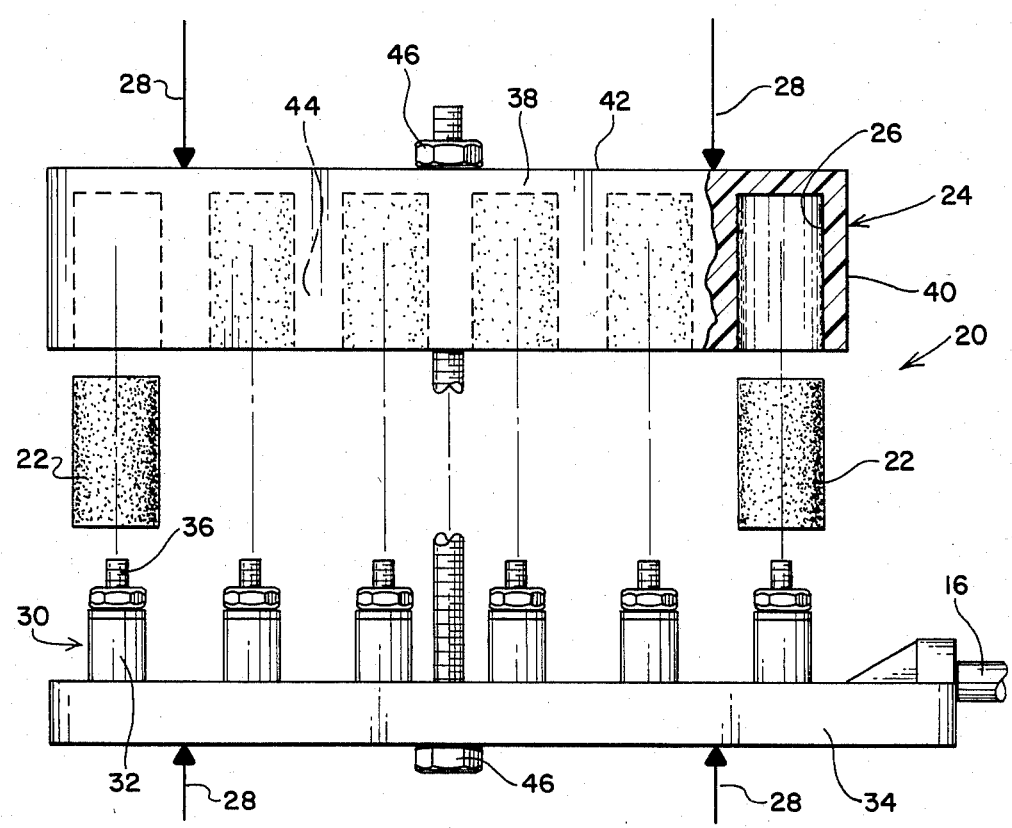
FIG. 2 provides an exploded view of one embodiment of a protection apparatus made in accordance with the principles of the present invention.

Reference is now made to FIG. 2 which provides an exploded view of one embodiment of a protection apparatus 20 made in accordance with the principles of the present invention. As shown in FIG. 2, the apparatus 20 includes these component elements: an insulating gel 22 (whose further particular characteristics are set forth below); a first means 24 to contain the gel 22 (here shown as a partitioned housing); a second means 26 to retain the gel within the first means 24 (i.e. the housing); and a force means 28 (shown symbolically in FIG. 2 as force vectors). The force means 28 acts on the first means 24 so that the gel 22 is maintained in compressive contact with an electrical contact 30 that is located on a support substrate 32 of a conventional termination block 34. At the same time, the force means 28 acts on the first means 24 so that the gel 22 substantially encapsulates a conductive portion 36 of the electrical contact 30.

The protection apparatus 20 shown in FIG. 2 has the following unique feature: if there is a release of the force means 28 and a disengagement of the first means 24 from the termination block 34, the gel 22 remains substantially with the first means 24 (i.e. the partitioned housing). The gel 22, moreover, is cleanly as well as immediately removed from the electrical contact 30. This unique feature enables the craftsperson to reenter the termination block 34 numerable times to effect repairs or change service wires connected to the electrical contact 30. In all such cases of reentry, the gel 22 remains substantially in the partitioned housing so that the crafts person can make repairs without obstruction or delay. After any repair is made, the craftsperson insures that the electrical contact 30 is environmentally portected by a method that includes the steps of:

1. providing an insulating gel 22;
2. providing a first means 24 of containing the gel 22;
3. providing a second means 26 for retaining the gel 22 within the first means 24; and
4. applying a force means 28 for acting on the first means 24 so that the gel 22 is maintained in compressive contact with the electrical contact 30 and substantially encapsulates the conductive portion 36 of the electrical contact 30.

There is now provided, in sequence, a more detailed description of the component elements set forth above for the protection apparatus 20 of the present invention.

The insulating gel 22 is particularly characterized by the following included features: (1) a cone penetration value from approximately 150 to 350 ($10^{-1}$ mm); an ultimate elongation of at least approximately 200%; a maximum tensile strength of approximately 20 psi; and a cohesive strength greater than its adhesive strength. (Note that the stated parameters are provided in accordance with the American National Standard designation ASTM D217 and ASTM D638 for the cone penetration and elongation parameters, respectively.)

The insulating gel 22 characterized by these stated features is prepared by extending a conventional aliphatic polyurethane composition with an admixture of mineral oil and vegetable oil from approximately 70 to 80%; the ratio of mineral oil to vegetable oil being approximately 0.7 to 2.4. Such an insulating gel 22 is tacky and is hydrolytically stable, moisture insensitive and substantially inert towards the support substrate 32. Additionally, the gel 22 is electrically insulating as it has a volume resistivity of at least approximately $10^9$ ohms centimeter. The gel 22 may also be provided with catalyst and other known additives such as moisture scavengers (e.g. benzoul chloride), antioxidants, pigments and fungicides, etc. (all well known in the art). Other specific compositions for an insulating gel are conceivable and may be employed within the scope of the present invention. For example, the composition can be realized as a non-tacky gel.

As described above, the protection apparatus 20 includes the first means 24 to contain the gel 22. In FIG. 2, the first means 24 is realized by a partitioned housing. The partitioned housing includes side walls 38, end walls 40, a bottom wall 42 and a plurality of partitions 44. In this embodiment, each partition included within the plurality of partitions 44 encapsulates an electrical contact 30. The partitioned housing may be composed of a plastic material.

The first means 24 may also be realized by a non-partitioned housing or "open-trough" type design (not shown). Other specific embodiments for the design and type of material to be employed in the realization of the first means 24 are conceivable and may be made within the scope of the present invention as heretofore described.

It is also indicated above that the protection apparatus 20 includes the second means 26 to retain the gel 22 within the first means 24 (i.e. the partitioned housing). In general, the second means 26 to retain the gel 22 may include means to provide a surface area of the first means greater than a surface area of the electrical contact 30. To this end, the second means 26 may be realized by a conventional surface treatment process that includes abrasion of the surface wall areas of the partitions or the inclusion of material protrusions (not shown) within the included partitions. The second means 26 to retain the gel 22 further includes chemical surface activation procedures such as a corona treatment or a chemical treatment to enhance adhesion of the gel 22 to the first means 24.

Finally, it is indicated above that the protection apparatus 20 includes the force means 28, shown symbolically as force vectors in FIG. 2. In one embodiment of the present invention, the force means 28 is realized as a conventional nut and bolt assembly 46 which acts to insure that the gel 22 is maintained in compressive contact with the electrical contact 30 and that the gel 22 substantially encapsulates the conductive portion 36 of the electrical contact 30. Optimal results are secured if the force means 28 (e.g. the nut and bolt assembly) operates as a directional force that acts along an axis defined by the electrical contact 30. Other specific embodiments (not shown) that realize the force means 28 include conventional tie wraps, string or bailing wire assemblies. It is noted, moreover, that the force means 28 may be realized by a force that is substantially non-varying in time or is dynamic.

The present invention, in summary, may be employed to provide a protection apparatus for electrical contacts. Although specific embodiments of the present invention have been described herein, it will be obvious to those skilled in the art that various modifications may be made without departing from the spirit of this invention. With such included modifications, the present invention is suitable for employment with a wide variety of devices including termination blocks, telephone connectors or conventional splice connectors. In all such cases of employment, a craftsperson can make numerous reentrys to the device while ensuring that the electrical contacts therein are protected when they are otherwise located in an adverse environment. With the foregoing in mind, it is understood that the invention be accorded the full scope of the appended claims.

I claim:

1. A protection apparatus for an electrical contact, comprising:
   (a) an insulating gel characterized by:
      (1) a cone penetration value from approximately 150 to 350 ($10^{-1}$ mm);
      (2) an ultimate elongation of at least approximately 200%;
      (3) a maximum tensile strength of approximately 20 psi;
      (4) a cohesive strength greater than its adhesive strength;
   (b) first means to contain said gel; and
   (c) second means to retain said gel within said first means; and
   (d) force means which acts on said first means so that said gel is maintained in compressive contact with said electrical contact and substantially encapsulates a conductive portion of said electrical contact, whereby upon release of said force means and a disengagement of said first means from said electrical contact, said gel remains substantially with said first means.

2. A method for protecting an electrical contact, comprising the steps:
   (a) providing an insulating gel characterized by:
      (1) a cone penetration value from approximately 150 to 350 ($10^{-1}$ mm);
      (2) an ultimate elongation of at least approximately 200%;
      (3) a maximum tensile strength of approximately 20 psi;
      (4) a cohesive strength greater than its adhesive strength; and
   (b) providing first means of containing said gel;
   (c) providing second means for retaining said gel within said first means; and
   (d) applying a force means for acting on said first means so that said gel is maintained in compressive contact with said electrical contact and substantially encapsulates a conductive portion of said electrical contact.

3. A protection apparatus for a termination block of the type that includes a substrate that supports a plurality of environmentally unprotected terminal binding posts, comprising:
   (a) an isolating gel characterized by:
      (1) a cone penetration value from approximately 150 to 350 ($10^{-1}$ mm);
      (2) an ultimate elongation of approximately 200%;
      (3) a maximum tensile strength of approximately 20 psi;
      (4) a cohesive strength greater than its adhesive strength;
   (b) first means to contain said gel;
   (c) second means to retain said gel within said first means; and
   (d) force means which acts on said first means so that said gel is maintained in compressive contact with said binding posts and substantially encapsulates an electrically conductive portion of said binding posts.

4. A protection apparatus for an electrical contact, comprising:
   (a) an aliphatic polyurethane composition extended with an admixture of mineral oil and vegetable oil from approximately 70 to 80%, the ratio of mineral oil to vegetable oil being approximately 0.7 to 2.4;
   (b) first means to contain a composition;
   (c) second means to retain said composition within said first means;
   (d) force means which acts on said first means so that said composition is maintained in compresive contact with said electrical contact and substantially encapsulates a conductive portion of said electrical contact.

5. A protection apparatus as recited in claims 1 or 3, wherein said first means to contain said gel comprises a housing that includes side walls, end walls and a bottom wall.

6. A protection apparatus as recited in claim 5, wherein said first means to contain said gel further comprises a plurality of partitions, wherein each partition included in said plurality encapsulates a terminal binding post.

7. A protection apparatus as recited in claim 5, wherein said housing is plastic.

8. A protection apparatus as recited in claims 1 or 3, wherein said second means to retain said gel includes means to provide a surface area of said first means greater than a surface area of said electrical contact.

9. A protection apparatus as recited in claim 8, wherein said second means includes a mechanical protrusion located within said first means.

10. A protection apparatus as recited in claim 3, wherein said force means is a directional force that acts along an axis defined by a terminal binding post.

11. A protection apparatus as recited in claim 3, wherein said force means is realized by a nut and bolt assembly which compresses said first means against said terminal binding post.

12. A protection apparatus as recited in claims 1 or 3, wherein said gel is substantially inert towards said substrate.

13. A protection apparatus as recited in claims 1 or 3 wherein said gel is hydrolytically stable and moisture-insensitive.

14. A protection apparatus as recited in claims 1 or 3, wherein said gel is tacky.

15. A protection apparatus as recited in claims 1 or 3, wherein said gel is non-tacky.

16. A protection apparatus as recited in claims 1 or 3, wherein said gel has a volume resistivity of at least approximately $10^9$ ohm centimeters.

17. A telephone circuit wire connector environmentally protected per the process of claim 2.

18. A telephone termination block environmentally protected per the process of claim 2.

19. A telephone splice connector environmentally protected per the process of claim 2.

* * * * *